(12) United States Patent
Lee

(10) Patent No.: US 7,067,369 B2
(45) Date of Patent: Jun. 27, 2006

(54) FLASH MEMORY CELL TRANSISTOR AND METHOD FOR FABRICATING THE SAME

(75) Inventor: Sang Don Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/998,966

(22) Filed: Nov. 30, 2004

(65) Prior Publication Data

US 2005/0230740 A1    Oct. 20, 2005

(30) Foreign Application Priority Data

Apr. 20, 2004    (KR) .................... 10-2004-0027253

(51) Int. Cl.
*H01L 21/8238*    (2006.01)

(52) U.S. Cl. .................... 438/216; 257/324; 257/369; 257/411

(58) Field of Classification Search .................... None
See application file for complete search history.

(56) References Cited

U.S. PATENT DOCUMENTS

2004/0180501 A1* 9/2004 Liu ............................ 438/275

OTHER PUBLICATIONS

Tomoko Ogura et al., "Embedded Twin MONOS Flash Memories with 4ns and 15ns Fast Access Times", Symposium on VLSI Circuits Digest of Technical Papers, 2003, pp. 207-210.

* cited by examiner

*Primary Examiner*—Tu-Tu Ho
(74) *Attorney, Agent, or Firm*—Heller Ehrman LLP

(57) ABSTRACT

A flash memory cell transistor and a method for fabricating the same compensates a work function difference of a pMOS and a nMOS with a triple gate insualting film by using electron density trapped in a pMOS gate insulating film. The flash memory cell transistor comprises a p-well region and a n-well region. The nMOS region comprises a nMOS channel ion-implantation region on the p-well region, a second gate oxide film on the nMOS channel ion-implantation region and a first n+ polysilicon gate electrode on the second gate oxide film. The pMOS region comprises a pMOS channel ion-implantation region on the n-well region, a first gate oxide film, an insulating film having an electron trap and the second gate oxide film which are sequentially formed on the pMOS channel ion-implantation region, and a second n+ polysilicon gate electrode on the second gate oxide film.

3 Claims, 10 Drawing Sheets

FLASH MEMORY CELL TRANSISTOR AND METHOD FOR FABRICATING THE SAME

BACKGROUND OF THE INVENTION

1. Field of the Invention

The present invention generally relates to a flash memory cell transistor, and more specifically, to a flash memory cell transistor which compensates a difference in work function of pMOS and nMOS with a triple gate insulating film by using electron density trapped in a pMOS gate insulating film.

2. Description of the Prior Art

FIG. 1 is a cross-sectional diagram illustrating an example of a conventional flash memory cell transistor.

Referring to FIG. 1, a n-well 4 and a p-well 3 are formed on a silicon substrate 1, and an isolation oxide film 2 is formed between the n-well 4 and the p-well 3. The flash memory cell transistor of FIG. 1 that has a structure of a CMOS transistor comprises a nMOS region and a pMOS region. In the nMOS region, a nMOS ion-implantation region 5, a gate oxide film 7 and a n+ polysilicon gate electrode 8 are sequentially formed on the p-well 3. In the pMOS region, a pMOS ion-implantation region 6, a gate oxide film 7 and the n+ polysilicon gate electrode 8 are sequentially formed on the n-well 4.

Since n+ polysilicon is used as gate electrodes of the nMOS and the pMOS in the CMOS transistor of FIG. 1, a process for forming a gate electrode is simple.

However, as shown from FIG. 2a which represents an energy level of the nMOS region and FIG. 2b which represents an energy level of the pMOS region, the work function of the n+ polysilicon which is a gate electrode is the same because the p-well region of the nMOS region has a different Fermi level from that of the n-well region of the pMOS region.

Provided that the p-well and the n-well are doped with p-type impurities and n-type impurities of $1.0e17/cm^3$, respectively, a work function difference ($\Phi_{MS}=\Phi_M-\Phi_{Si}$) between a gate electrode and a semiconductor region is −0.98V in case of nMOS and −0.15V in case of pMOS.

In order to reduce the work function difference in the prior art of FIG. 1, p-type impurities that are the same as the p-well are ion-implanted in the nMOS channel ion-implantation region 5 while p-type impurities that are opposite to the n-well are ion-implanted in the pMOS ion-implantation region 6.

As the semiconductor technology has been improved, the channel length of nMOS and pMOS transistors becomes shorter and the thickness of a gate oxide film becomes thinner. As a result, an absolute value of a threshold voltage becomes smaller, and concentration of wells and channel ion-implantation becomes larger, so that a level of the threshold voltage is required to be maintained.

However, as shown in FIG. 1, ion-implantation impurities of the well are n-type but ion-implantation impurities of the channel region are p-type in case of pMOS. Therefore, as the concentration of the well becomes higher, that of the channel region is required to be also higher. As a result, it is difficult to fabricate a pMOS transistor in the prior art since the pMOS transistor having the channel length of less than 0.15 μm has a large short channel effect.

In order to solve the problem of the transistor in FIG. 1, the example of FIG. 3 where n+ polysilicon is used as a nMOS gate electrode and p+ polysilicon is used as a pMOS gate electrode has been disclosed.

In the transistor of FIG. 3, a n-well 4 and a p-well 3 are formed on a silicon substrate 1, and an isolation oxide film 2 is formed between the n-well 4 and the p-well 3. The flash memory cell transistor of FIG. 3 that has a structure of a CMOS transistor comprises a nMOS region and a pMOS region. In the nMOS region, a nMOS ion-implantation region 5, a gate oxide film 7 and a n+ polysilicon gate electrode 8 are sequentially formed on the p-well 3. In the pMOS region, a pMOS ion-implantation region 6, a gate oxide film 7 and a p+ ek silicon gate electrode 9 are sequentially formed on the n-well 4.

However, as shown from FIG. 4a which represents an energy level of the nMOS region and FIG. 4b which represents an energy level of the pMOS region, the work function of the n+ polysilicon in the nMOS region is 4.05 eV while that of the p+ polysilicon in the pMOS region is 5.15 eV.

Provided that the p-well and the n-well are doped with p-type impurities and n-type impurities of $1.0e17/cm^3$, respectively, a work function difference ($\Phi_{MS}=\Phi_M-\Phi_{Si}$) between a gate electrode and a semiconductor region is −0.97V in case of nMOS and +0.97V in case of pMOS, which are different in marks but the same in size. That is, the difference has a symmetrical structure since the threshold voltage of the nMOS is a positive value while that of the pMOS is a negative value.

In the transistor of FIG. 3, n+ polysilicon is used as a nMOS gate electrode, and p+ polysilicon is used as a pMOS gate electrode. P-type impurities which is the same as the p-well are ion-implanted in the nMOS channel ion-implantation region 5, and n-type impurities which is the same as the n-well are ion-implanted in the pMOS channel ion-implantation region 6. As a result, the short channel effect of the nMOS and the pMOS can be reduced in comparison with FIG. 1.

However, as the semiconductor technology has been improved, the thickness of the gate oxide film becomes thinner. As a result, the p-type impurities doped on the p+ polysilicon are diffused from the p+ polysilicon to the gate oxide film and the pMoS channel region during a subsequent thermal treatment process.

The p-type impurities diffused into the gate oxide film reduce reliability of the gate oxide film, and the p-type impurities diffused into the pMOS channel region through the gate oxide film change the value of the threshold voltage of the pMOS transistor.

Also, in a process for forming n+ and p+ polysilicon gates to the nMOS and the pMOS, respectively, inter-diffusion between the n+ polysilicon and the p+ polysilicon is required to be prevented in comparison with FIG. 1.

When the p+ polysilicon is used, the thickness of the gate oxide film becomes thinner due to insufficient doping of p-type impurities between the p+ polysilicon gate and the gate oxide film to increase poly depletion. As a result, the thickness of the effective gate oxide film becomes thicker and a current driving power is decreased.

SUMMARY OF THE INVENTION

Accordingly, it is an object of the present invention to provide a flash memory cell transistor comprising a nMOS region and a pMOS region which are formed of the same n+ polysilicon, where a gate oxide film is used in the nMOS region and a triple gate insulating film including a first gate oxide film, an insulating film having an electron trap and a second gate oxide film, thereby compensating a work function difference between the pMOS and nMOS with electron density trapped in the gate insulating film of the pMOS.

In an embodiment, a flash memory cell transistor comprises a p-well region and a n-well region which are divided by an isolation oxide film on a silicon substrate, a nMOS region and a pMOS region. The nMOS region comprises a nMOS channel ion-implantation region on the p-well region, a second gate oxide film on the nMOS channel ion-implantation region and a first n+ polysilicon gate electrode on the second gate oxide film. The pMOS region comprises a pMOS channel ion-implantation region on the n-well region, a first gate oxide film, an insulating film having an electron trap and the second gate oxide film which are sequentially formed on the pMOS channel ion-implantation region, and a second n+ polysilicon gate electrode on the second gate oxide film.

In an embodiment, a method for fabricating a flash memory cell transistor comprises:

the first step of forming a n-well region and a p-well region on a silicon substrate which are divided by an isolation film;

the second step of after performing a nMOS channel ion-implantation with p-type ions which are identical with the p-well region and a pMOS channel ion-implantation with n-type ions which are identical with the n-well region, sequentially depositing a first gate oxide film, an insulating film having an electron trap, and a buffer oxide film on the exposed p-well and n-well regions;

the third step of coating a photoresist film and patterning the film with a pMOS oxide film mask to etch the insulating film having an electron trap in the n-well region using the buffer oxide film of the exposed nMOS region as a mask and simultaneously etch the first gate oxide film and the buffer oxide film of the exposed nMOS region;

the fourth step of forming a second gate oxide film on the p-well region of the exposed nMOS region and insulating film having an electron trap of the pMOS region;

the fifth step of depositing a n+ polysilicon gate electrode on the second gate oxide film; and the sixth step of coating a photoresist film and patterning the n+ polysilicon gate electrode using a gate mask to etch the n+ polysilicon of the exposed region and remove the residual photoresist film.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 5:
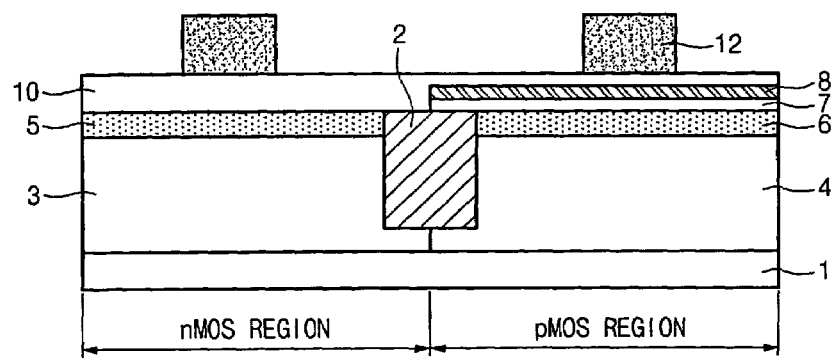
FIG. 5 is a cross-sectional diagram illustrating a flash memory cell transistor according to an embodiment of the present invention.

In an embodiment, as shown in FIG. 5, a p-well region 3 and a n-well region 4 which are divided by an isolation oxide film region 2 are formed on a silicon substrate 1. A nMOS channel ion-implantation region 5 is formed on the p-well region 3, and a second gate oxide film 9 is formed on the nMOS channel ion-implantation region 5, and an n+ polysilicon gate electrode 12 is formed on the second gate oxide film 10. Additionally, a pMOS channel ion-implantation region 6 is formed on the n-well region 4. Then, a first gate oxide film 7, an insulating film 8 having an electron trap and a second gate oxide film 10 are sequentially formed on the pMOs channel ion-implantation region 6. The n+ polysilicon gate electrode 12 is formed thereon.

In the above-described transistor of FIG. 5, although the same n+ polysilicon is used to the nMOS region and the pMOS region (see FIG. 1), only the gate oxide film is used in the nMOS region, and a triple gate insulating film including a second gate oxide film formed on the insulating film 8 having an electron trap formed on the first gate oxide film 7 is used in the pMOS region.

A work function difference between the pMOS and the nMOS is compensated with electron density trapped in the gate insulating film the pMOS.

Figure 1:
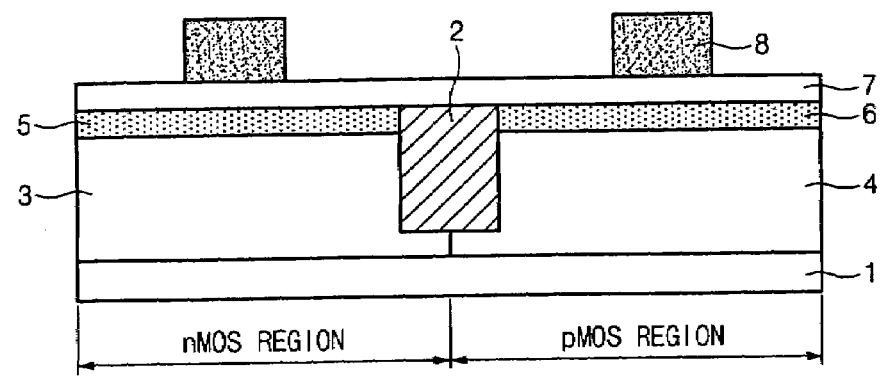
FIG. 1 is a cross-sectional diagram illustrating an example of a conventional flash memory cell transistor.
Figure 2A:
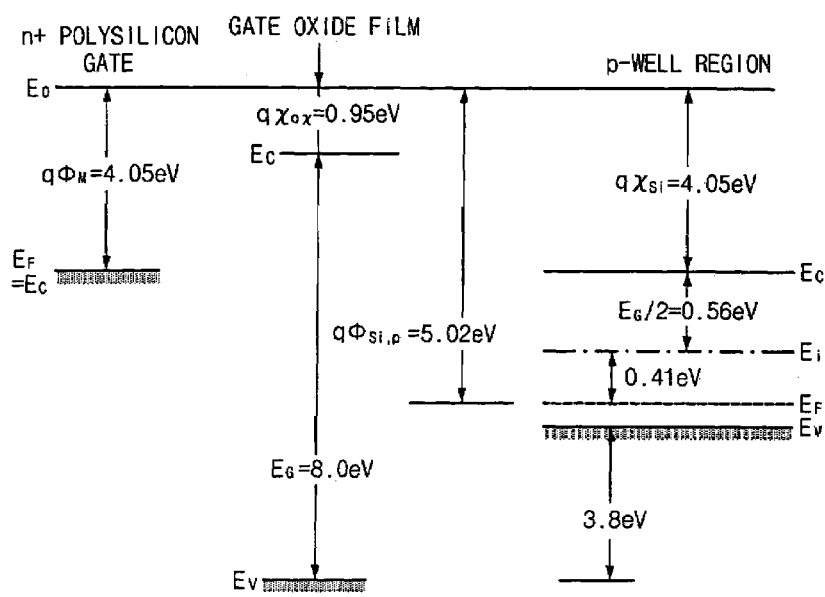
FIGS. 2a and 2b are diagrams illustrating operations of a nMOS region and a pMOS region of FIG. 1.
Figure 2B:
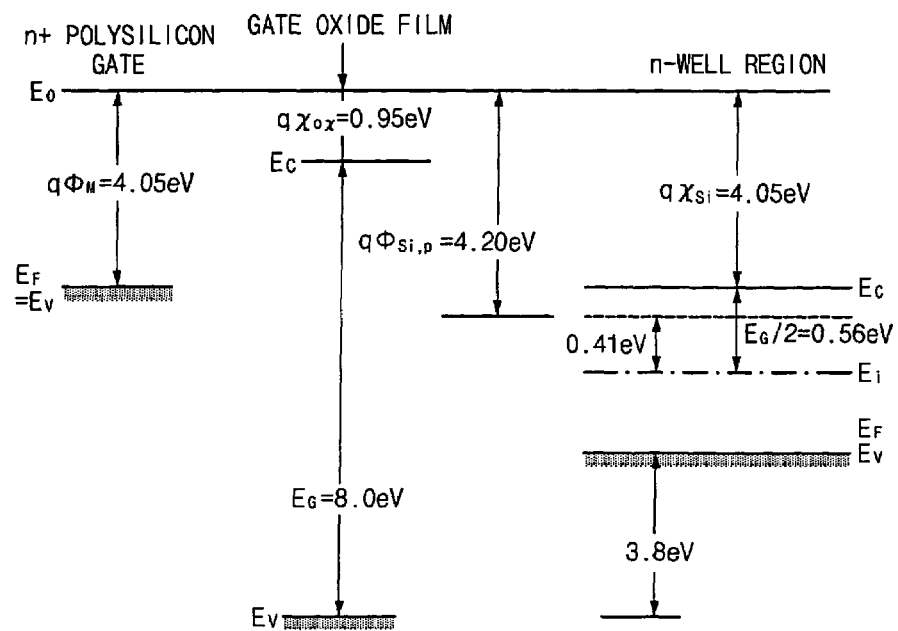
Figure 3:
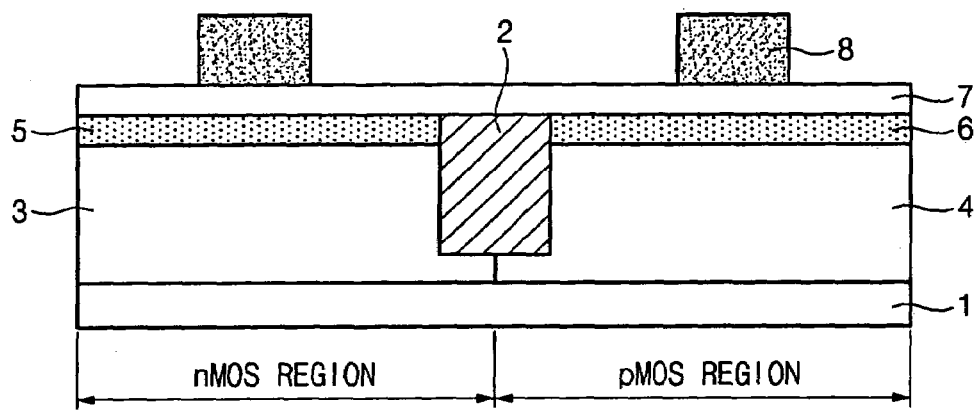
FIG. 3 is a cross-sectional diagram illustrating another example of a conventional flash memory cell transistor.
Figure 4A:
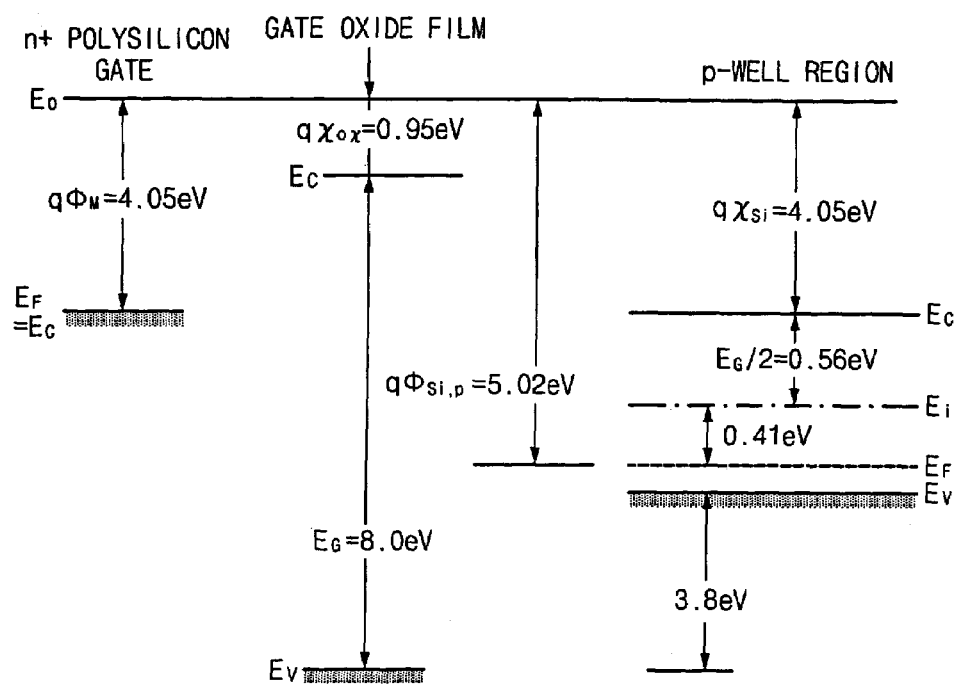
FIGS. 4a and 4b are diagrams illustrating operations of a nMOS region and a pMOS region of FIG. 1.
Figure 4B:
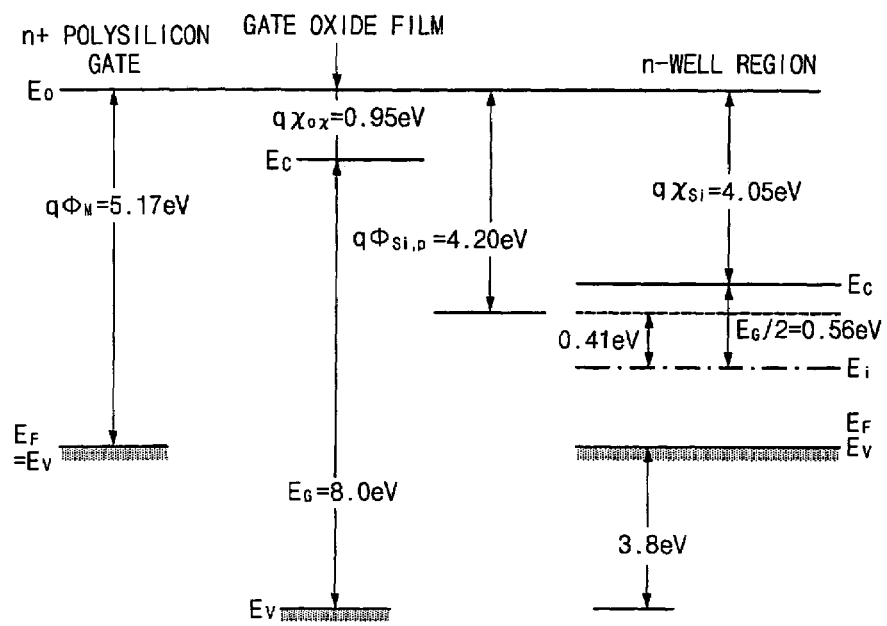

In the example of FIG. 5, the disadvantage in increase of the short channel effect is solved by using the channel region ion-implanted with p-type impurities which is opposite to the n-well in the pMOS region as shown in FIG. 1, and the disadvantage in diffusion of impurities doped in the p+ polysilicon into the gate oxide film and the pMOS channel region during the subsequent thermal treatment process is improved.

A flat bandwidth voltage $V_{FB}$ is defined by the following Equation 1.

$$v_{FB} = \phi_{MS} - \frac{Q_f}{C_{OX}} \cdot \int^{T_{OX}} \frac{x \cdot \rho(x)}{T_{OX}} dx \qquad \text{[Equation 1]}$$

Here, $Q_f$ is the charge fixed between the silicon substrate and the gate oxide film, $C_{OX}$ is the capacitance of the gate insulating film, $T_{OX}$ is the thickness of the effective oxide film of the gate insulating film, x is the from the surface of the silicon substrate, and $\rho(x)$ is the density trapped in the gate insulating film from the distance x.

Since $Q_f$ is the quantity fixed depending on a process, the work function difference between the n-well and the pMOS gate having an n+ polysilicon gate can be compensated by using the triple gate insulating film including the second gate oxide film formed on the insulating film having an electron trap formed on the first gate oxide film in the pMOS region.

That is, while the n-type impurities which is the same as the n-well are ion-implanted in the channel region, the n+ polysilicon is used in the pMOS region.

FIGS. 6a to 6e are diagrams illustrating a process for fabricating a flash memory cell transistor according to an embodiment of the present invention.

Figure 6A:
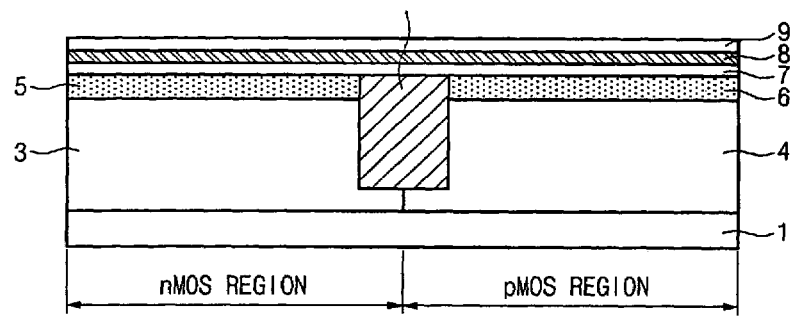
FIGS. 6a to 6e are diagrams illustrating a process for fabricating a flash memory cell transistor according to an embodiment of the present invention.

As shown in FIG. 6a, a p-well region 3 and n-well region 4 which are divided by an isolation oxide film 2 are formed on a silicon substrate 1. Then, p-type impurities which are the same as the p-well region 3 are ion-implanted in a nMOS channel, and n-type impurities which are the same as the n-well region 4 are ion-implanted in a pMOS channel. Next, a first gate oxide film 7 is formed on the exposed p-well and n-well regions 3 and 4, and an insulating film 8 having an electron trap such as $N_2O$, $Si_3N_4$, $Al_2O_3$ or $HfO_2$ is deposited thereon. Thereafter, a buffer oxide film 9 is formed thereon.

Figure 6B:
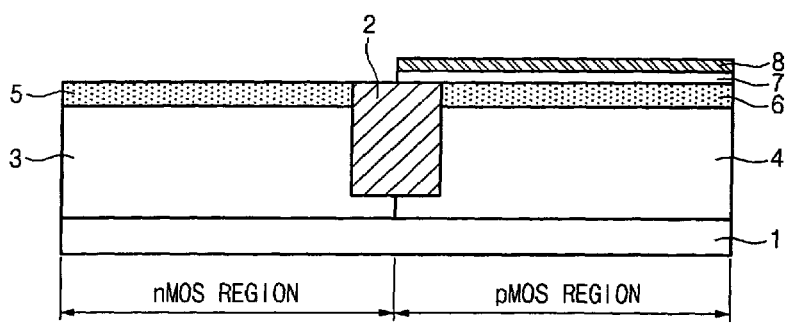

As shown in FIG. 6b, a photoresist film (not shown) is coated and patterned with a pMOS oxide film mask. Then, the insulating film 8 having an electron trap of the nMOS region is etched using the buffer oxide film 9 of the exposed nMOS region as a mask. Thereafter, the first gate oxide film 7 and the buffer oxide film 9 of the exposed nMOS region are simultaneously etched.

Here, an example when the buffer oxide film 9 of the pMOS region is completely etched may be differentiated from that when the buffer oxide film 9 is partially etched so that the thickness of the buffer oxide film 9 is reduced.

Figure 6C:
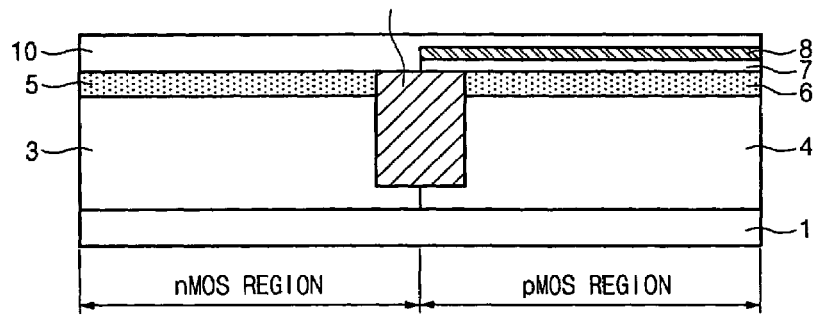

As shown in FIG. 6c, a second gate oxide film 10 is formed on the p-well region 3 of the exposed nMOS region and the insulating film 8 having an electron trap of pMOS region.

Here, the thickness of the second gate oxide film 10 formed on the p-well region 3 of the nMOS region becomes thicker than that of the second gate oxide film 10 formed on the insulating film 8 having an electron trap of the pMOS region. Therefore, the thickness of the second gate oxide film 10 in the nMOs region is regulated to be identical with that of a triple insulating film including the first gate oxide film 7, the insulating film 8 having an electron trap and the second gate oxide film 10 in the pMOS region. As a result, the thickness of the first gate oxide film 7 and the insulating film 8 should be properly regulated.

Figure 6D:
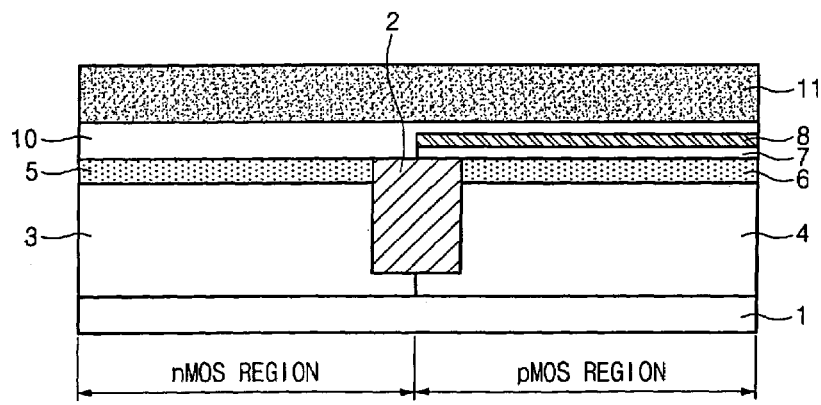

As shown in FIG. 6d, an n+ polysilicon layer 11 is deposited on the second gate oxide film 10.

Figure 6E:
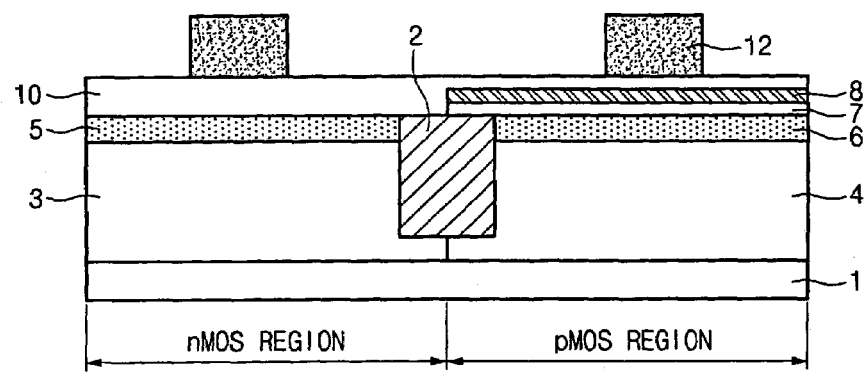

As shown in FIG. 6e, after a photoresist film (not shown) is coated and patterned using a gate mask, the n+ polysilicon layer 11 of the exposed region is etched to form an n+ polysilicon gate electrode 12, and the residual photoresist film is removed.

After the process of FIG. 6e, a LDD region, a gate side wall insulating film, a source drain region and a metal contact and wire are sequentially formed, thereby obtaining a transistor.

As discussed earlier, a flash memory cell transistor according to an embodiment of the present invention comprises a nMOS region and a pMOS region which are formed of the same n+ polysilicon, where a gate oxide film is used in the nMOS region and a triple gate insulating film including a first gate oxide film, an insulating film having an electron trap and a second gate oxide film, thereby compensating a work function difference between the pMOS and nMOS with electron density trapped in the gate insulating film of the pMOS.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

The invention claimed is:

1. A method for fabricating a flash memory cell transistor, comprising:
   the first step of forming a n-well region and a p-well region on a silicon substrate which are divided by an isolation film;
   the second step of after performing a nMOS channel ion-implantation with p-type ions which are identical with the p-well region and a pMOS channel ion-implantation with n-type ions which are identical with the n-well region, sequentially depositing a first gate oxide film, an insulating film having an electron trap, and a buffer oxide film on the exposed p-well and n-well regions;
   the third step of coating a photoresist film and patterning the film with a pMOS oxide film mask to etch the insulating film having an electron trap in the n-well region using the buffer oxide film of the exposed nMOS region as a mask and simultaneously etch the first gate oxide film and the buffer oxide film of the exposed nMOS region;
   the fourth step of forming a second gate oxide film on the p-well region of the exposed nMOS region and the insulating film having an electron trap of the pMOS region;
   the fifth step of depositing a n+ polysilicon gate electrode on the second gate oxide film; and
   the sixth step of coating a photoresist film and patterning the n+ polysilicon gate electrode using a gate mask to etch the n+ polysilicon of the exposed region and remove the residual photoresist film.

2. The method according to claim 1, wherein the buffer oxide film of the pMOS region in the third step is completely etched.

3. The method according to claim 1, wherein the buffer oxide film of the pMOS region in the third step is partially etched, so that the thickness of the buffer oxide film is reduced.

* * * * *